(12) United States Patent
Kim et al.

(10) Patent No.: US 8,071,979 B2
(45) Date of Patent: Dec. 6, 2011

(54) DISPLAY DEVICE

(75) Inventors: Dowan Kim, Gumi (KR); Changhyung Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 297 days.

(21) Appl. No.: 11/952,689

(22) Filed: Dec. 7, 2007

(65) Prior Publication Data
US 2009/0008642 A1    Jan. 8, 2009

(30) Foreign Application Priority Data
Jun. 8, 2007   (KR) .................. 10-2007-0055988

(51) Int. Cl.
*H01L 29/04* (2006.01)
*H01L 29/10* (2006.01)
*H01L 29/12* (2006.01)
*H01L 31/00* (2006.01)
*G02F 1/1345* (2006.01)

(52) U.S. Cl. ............ 257/59; 257/71; 349/149; 349/150; 349/151

(58) Field of Classification Search .................. None
See application file for complete search history.

(56) References Cited

U.S. PATENT DOCUMENTS
2006/0044505 A1 *   3/2006   Nakazawa ................. 349/150
2006/0244741 A1 *  11/2006   Kimura et al. ............. 345/204
* cited by examiner

*Primary Examiner* — N Drew Richards
*Assistant Examiner* — Michael Jung
(74) *Attorney, Agent, or Firm* — Morgan, Lewis & Bockius LLP

(57) ABSTRACT

A display device is disclosed. The display device includes a substrate, a display area on the substrate, the display area including a plurality of subpixels, a pad area on the substrate, the pad area including a pad electrode, a conductive adhesive layer on the pad electrode, and a driver on the conductive adhesive layer, the driver being attached to the pad electrode using the conductive adhesive layer. One surface of the conductive adhesive layer includes one surface of the driver. A vertical distance ranging from a shorter side of one surface of the driver to a shorter side of one surface of the conductive adhesive layer lies substantially in a range between 0.2 mm and 4 mm.

11 Claims, 9 Drawing Sheets

DISPLAY DEVICE

This application claims the benefit of Korean Patent Application No. 10-2007-0055988 filed on Jun. 8, 2007, which is hereby incorporated by reference.

BACKGROUND OF THE DISCLOSURE

1. Field of the Disclosure

Exemplary embodiments relate to a display device.

2. Description of the Related Art

The importance of display devices has recently increased with the growth of multimedia. Various types of display devices such as liquid crystal displays (LCDs), plasma display panels (PDPs), field emission displays (FEDs), and organic light emitting devices have been put to practical use.

Among them, the organic light emitting device has come into the spotlight as a next generation display device because of the advantages of the organic light emitting device. The organic light emitting device has better visibility than a cathode-ray tube, has low average power consumption, and generates less heat. The organic light emitting device has fast response speed, for example, about 1 ms, has low average power consumption, and does not have a viewable angle problem because the organic light emitting device is a self emitting device.

Such the display device is driven based on one of a passive matrix method and an active matrix method using a thin film transistor. In the passive matrix method, anodes and cathodes are formed orthogonally, and the display device is driven by selecting predetermined lines. On the contrary, in the active matrix method, a thin film transistor is connected to each pixel electrode, and the display device is driven according to a voltage maintained by a capacitor connected to a gate electrode of the thin film transistor.

The display device includes a display area for displaying images and a driver for driving the display area. The driver includes a printed circuit board (PCB) including parts for generating various control signal and data signals. The driver also includes a driver integrated circuit (IC), which is connected to the PCB and the display panel, for applying a signal to lines of a display panel. The display device may be classified into a chip on glass (COG) type, a tape carrier package (TCP) type, and a chip on film (COF) type according to a method of packaging the driver IC into a panel.

Pad electrodes on a pad area may be electrically connected to the driver by a conductive adhesive layer.

The pad area and the driver may be formed by coating an anisotropic conductive film (ACF) on the pad area and compressing the driver on the pad area. However, the conductive adhesive layer was coated on the pad area corresponding to the size of the driver. That is, the conductive adhesive layer was coated only in consideration of the adhesive function.

The pad electrodes inside the pad area were easily eroded by moisture and oxygen thereby deteriorating the reliability of a display device.

SUMMARY OF THE DISCLOSURE

Exemplary embodiments provide a display device capable of improving the reliability of the display device.

In one aspect, a display device comprises a substrate, a display area on the substrate, the display area including a plurality of subpixels, a pad area on the substrate, the pad area including a pad electrode, a conductive adhesive layer on the pad electrode, and a driver on the conductive adhesive layer, the driver being attached to the pad electrode using the conductive adhesive layer, wherein one surface of the conductive adhesive layer includes one surface of the driver, and a vertical distance ranging from a shorter side of one surface of the driver to a shorter side of one surface of the conductive adhesive layer lies substantially in a range between 0.2 mm and 4 mm.

In another aspect, a display device comprises a substrate, a display area on the substrate, the display area including a plurality of subpixels, a pad area on the substrate, the pad area including a pad electrode, a conductive adhesive layer on the pad electrode, and a driver on the conductive adhesive layer, the driver being attached to the pad electrode using the conductive adhesive layer, wherein one surface of the conductive adhesive layer includes one surface of the driver, and a vertical distance ranging from a longer side of one surface of the driver to a longer side of one surface of the conductive adhesive layer lies substantially in a range between 0.1 mm and 1 mm.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

Figure 1:
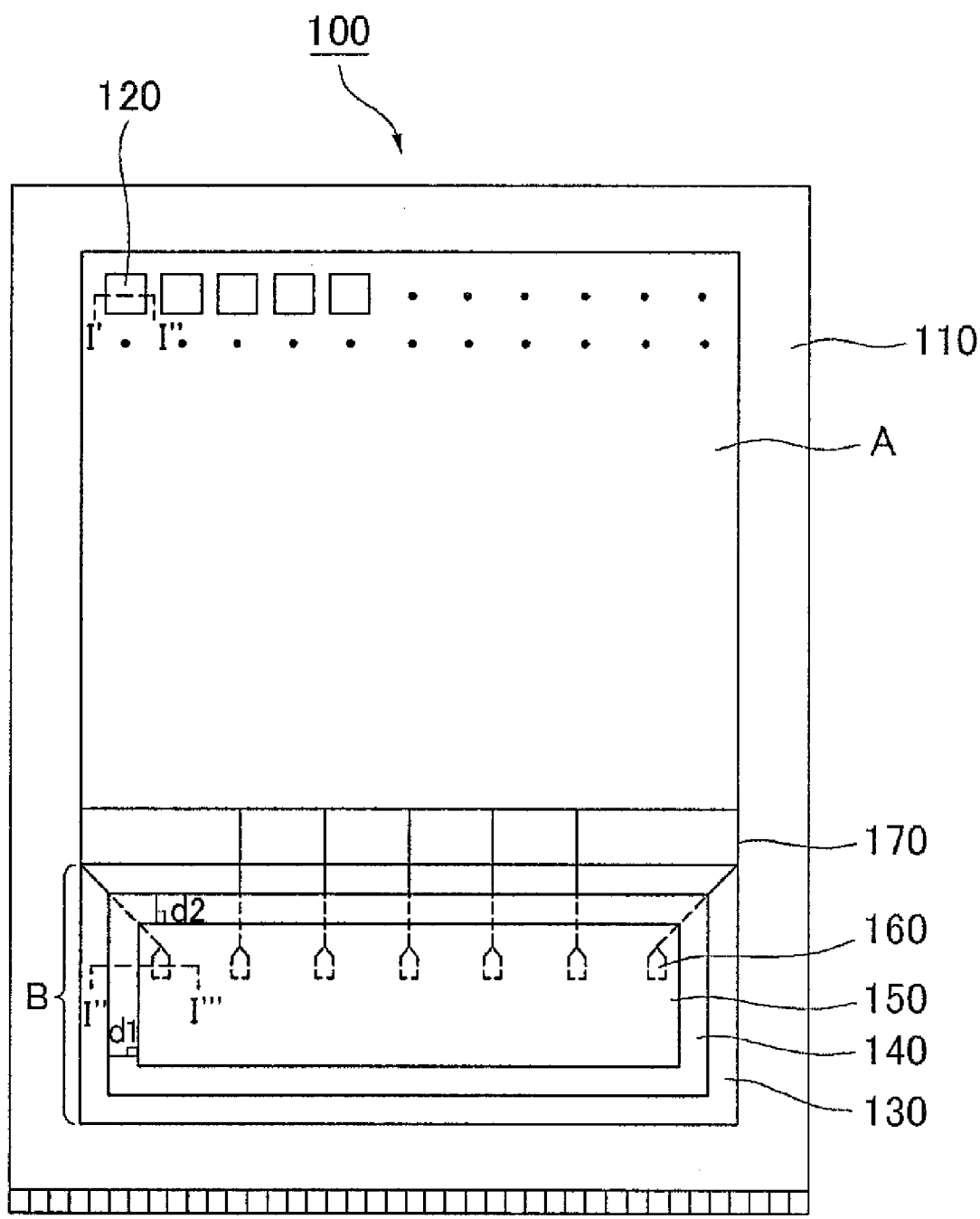
FIGS. 1 and 2 are plan views of a display device according to an exemplary embodiment.
Figure 2:
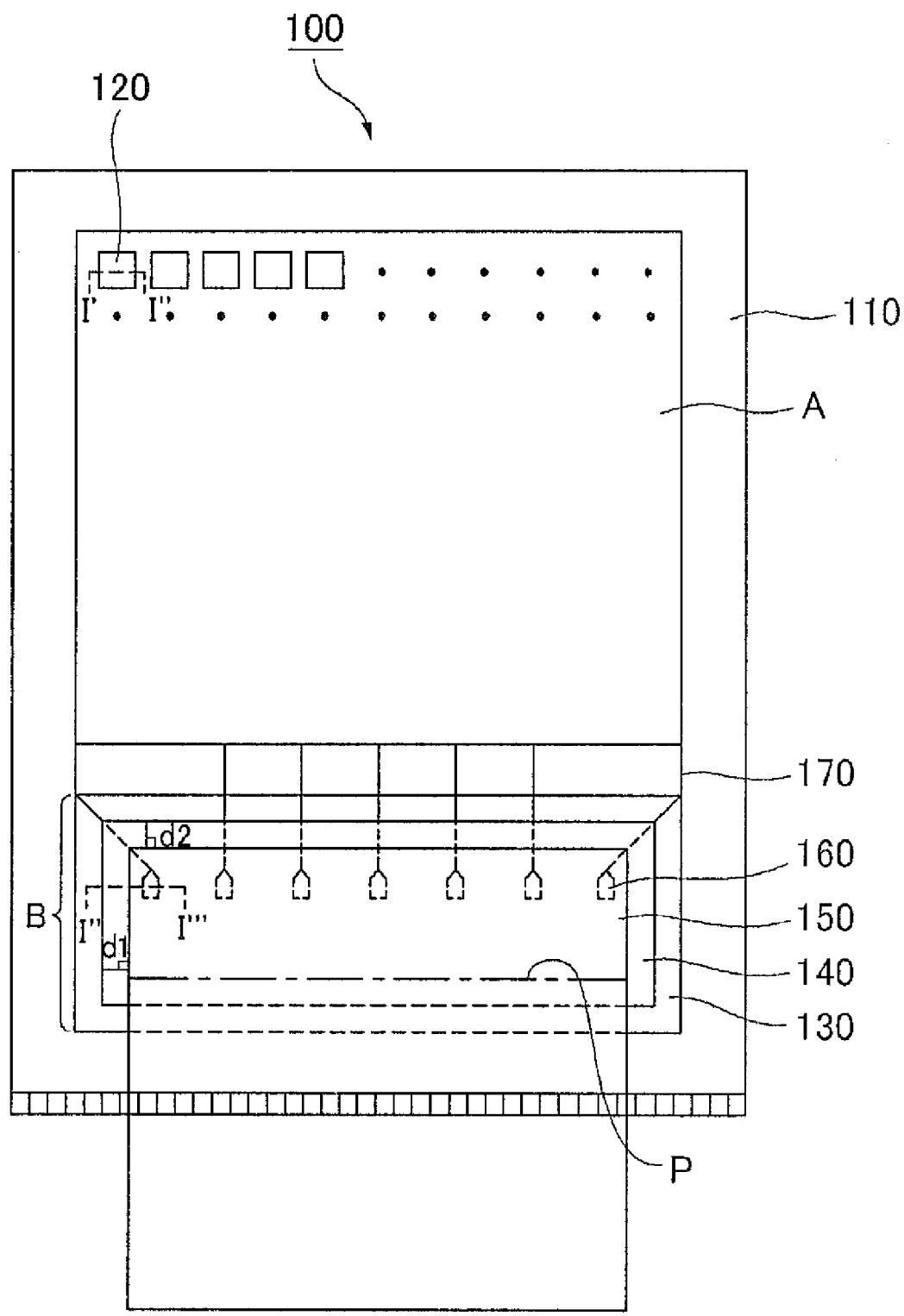

FIGS. 1 and 2 are plane views of a display device according to an exemplary embodiment.

Referring to FIG. 1 and FIG. 2, a display device 100 includes a display area (A) including a plurality of subpixels 120 on a substrate 110 and a pad area (B) including a plurality of pad electrodes 160.

Although the pad area (B) is an area distinguished from the display area (A) on the substrate 110, the pad area (B) may indicate a formation area of conductive layers and a second insulating layer which will be described in later.

A driver 150 is disposed on the pad area (B) to apply driving signals to the display area (A). Also, the display device 100 includes a plurality of lines 170 for connecting the display area (A) to the driver 150 or connecting the pad area (B) to the driver 150.

The display device 100 includes a conductive adhesive layer used to attach the pad electrode 160 to the driver 150.

The conductive adhesive layer 140 may be an anisotropic conductive film (ACF). Herein, the pad electrode 160, the driver 150, and the conductive adhesive layer 140 will be described in more detail. The display device 100 may further include an insulating layer 130 for exposing the pad electrodes 160. Herein, the insulating layer 130 may be a third insulation layer.

The display device 100 may be classified into a chip on glass (COG) type and a chip on film (COF) type depending on a method of attaching the pad electrode 160 to the driver 150.

As shown in FIG. 1 showing the COG type display device, the conductive adhesive layer 140 is disposed on the pad electrode 160, and the driver 150 on the conductive adhesive layer 140 may be a driver IC 150.

That is, the COG type may increase an area of the display device 100 that the display area (A) occupies because the driver 150 is directly mounted on the substrate 110.

As shown in FIG. 2 showing the COF type display device, the driver 150 on the conductive adhesive layer 140 may include a flexible film 150 and a driver IC (not shown) on the flexible film 150. The flexible film 150 may be connected to the conductive adhesive layer 140 instead of the driver IC. The driver IC may be disposed at different areas on the flexible film 150 depending on the size of elements of the driver IC and the location relation with other constituent elements. In FIG. 2, the driver and the flexible film are indicated as reference numeral 150.

The flexible film may be a flexible printed circuit (FPC).

Figure 3:
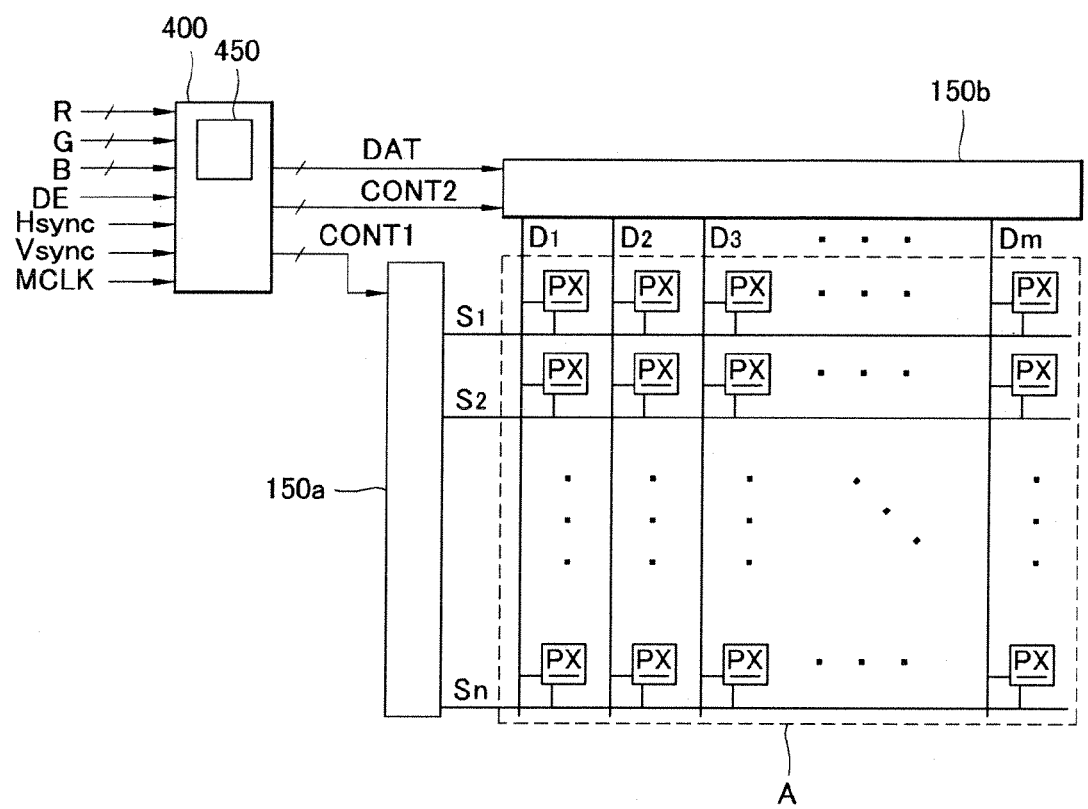
FIG. 3 is a bock diagram of the display device according to the exemplary embodiment.
Figure 4:
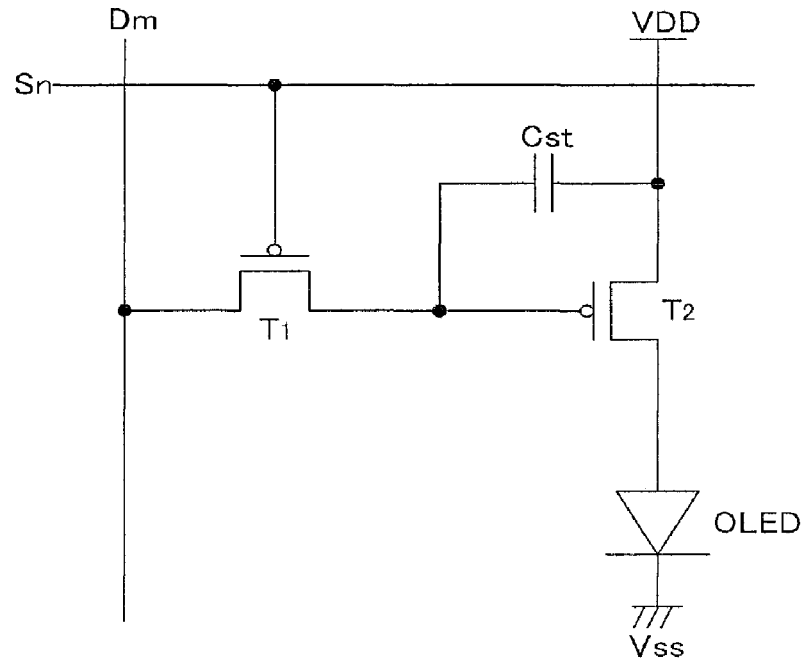
FIGS. 4 and 5 are circuit diagrams of a subpixel of the display device.
Figure 5:
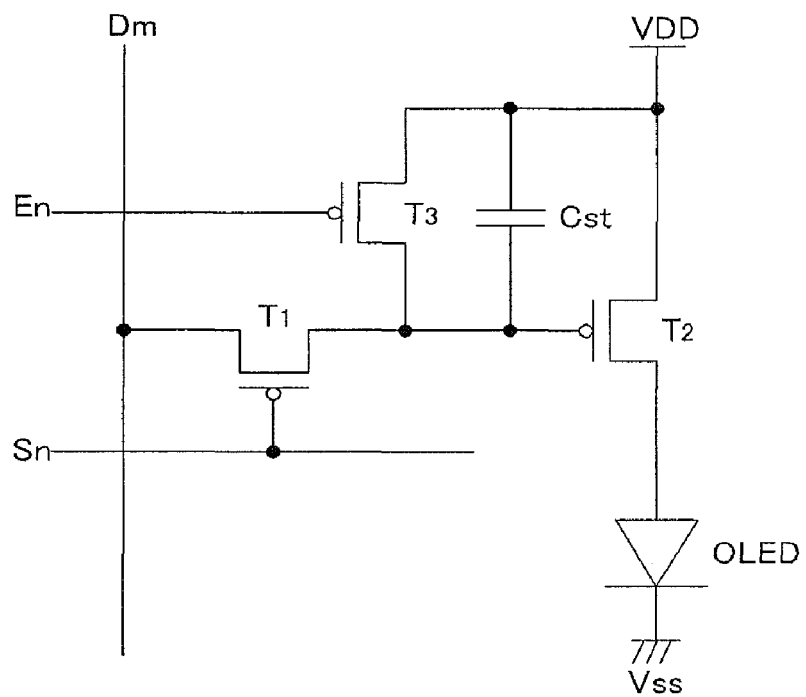

FIG. 3 is a bock diagram of the display device 100 according to the exemplary embodiment. FIGS. 4 and 5 are circuit diagrams of a subpixel of the display device 100.

As shown in FIG. 3, the display device according to the exemplary embodiment includes the display area (A), a scan driver 150a, a data driver 150b, and a controller 400.

The display area (A) includes a plurality of signal lines S1 to Sn and D1 to Dm, a plurality of power supply lines (not shown), and a plurality of subpixels PX connected to the signal lines S1 to Sn and D1 to Dm and the power supply lines in a matrix form.

The plurality of signal lines S1 to Sn and D1 to Dm may include the plurality of scan lines S1 to Sn for sending scan signals and the plurality of data lines D1 to Dm for sending data signals. Each power supply line may send voltages such as a power voltage VDD to each subpixel PX.

Although the signal lines include the scan lines S1 to Sn and the data lines D1 to Dm in FIG. 3, the exemplary embodiment is not limited thereto. The signal lines may further include erase lines (not shown) for sending erase signals depending on a driving manner.

However, an erase line may not be used to send an erase signal. The erase signal may be sent through another signal line. For instance, although it is not shown, the erase signal may be supplied to the display area (A) through the power supply line in case that the power supply line for supplying the power voltage VDD is formed.

As shown in FIG. 4, the subpixel PX may include a switching thin film transistor T1 for sending the data signal in response to the scan signal sent through the scan line Sn, a capacitor Cst for storing the data signal, a driving thin film transistor T2 producing a driving current corresponding to a voltage difference between the data signal stored in the capacitor Cst and the power voltage VDD, and an organic light emitting diode (OLED) emitting light corresponding to the driving current.

As shown in FIG. 5, the subpixel PX may include a switching thin film transistor T1 for sending the data signal in response to the scan signal sent through the scan line Sn, a capacitor Cst for storing the data signal, a driving thin film transistor T2 producing a driving current corresponding to a voltage difference between the data signal stored in the capacitor Cst and the power voltage VDD, an organic light emitting diode (OLED) emitting light corresponding to the driving current, and an erase switching thin film transistor T3 for erasing the data signal stored in the capacitor Cst in response to an erase signal sent through an erase line En.

When the display device 100 is driven in a digital driving manner that represents a gray scale by dividing one frame into a plurality of subfields, the pixel circuit of FIG. 5 can control an emission time by supplying an erase signal to a subfield whose a light-emission is shorter than an addressing time. The pixel circuit of FIG. 5 has an advantage capable of reducing a lowest luminance of the display device 100.

A difference between driving voltages, e.g., the power voltages VDD and Vss of the display device 100 may change depending on the size of the display area (A) and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

Referring again to FIG. 3, the scan driver 150a is connected to the scan lines S1 to Sn of the display area (A) to apply scan signals capable of turning on the switching thin film transistor T1 to the scan lines S1 to Sn, respectively.

The data driver 150b is connected to the data lines D1 to Dm of the display area (A) to apply data signals indicating an output video signal DAT' to the data lines D1 to Dm, respectively. The data driver 150b may include at least one data driver IC connected to the data lines D1 to Dm.

The data driving IC may include a shift register, a latch, a digital-to-analog (DA) converter, and an output buffer connected to one another in the order named.

When a horizontal sync start signal (STH) (or a shift clock signal) is received, the shift register can send the output video signal DAT' to the latch in response to a data clock signal (HLCK). In case that the data driver 150b includes a plurality of data driving ICs, a shift register of a data driving IC can send a shift clock signal to a shift register of a next data driving IC.

The latch memorizes the output video signal DAT', selects a gray voltage corresponding to the memorized output video signal DAT' in response to a load signal, and sends the gray voltage to the output buffer.

The DA converter selects the corresponding gray voltage in response to the output video signal DAT' and sends the gray voltage to the output buffer.

The output buffer outputs an output voltage (serving as a data signal) received from the DA converter to the data lines D1 to Dm, and maintains the output of the output voltage for 1 horizontal period (1H).

The controller 400 controls an operation of the scan driver 150a and an operation of the data driver 150b. The controller 400 may include a signal conversion unit 450 that gamma-converts input video signals R, G and B into the output video signal DAT' and produces the output video signal DAT'.

The controller 400 produces a scan control signal CONT1 and a data control signal CONT2, and the like. Then, the controller 400 outputs the scan control signal CONT1 to the scan driver 150a and outputs the data control signal CONT2 and the processed output video signal DAT' to the data driver 150b.

The controller 400 receives the input video signals R, G and B and an input control signal for controlling the display of the input video signals R, G and B from a graphic controller (not shown) outside the display device 100. Examples of the input control signal include a vertical sync signal Vsync, a horizontal sync signal Hsync, a main clock signal MCLK and a data enable signal DE.

Each of the driving devices 150a, 150b and 400 may be directly mounted on the display area (A) in the form of at least one IC chip, or may be attached to the display area (A) in the form of a tape carrier package (TCP) in a state where the driving devices 150a, 150b and 400 each are mounted on a flexible printed circuit film (not shown), or may be mounted on a separate printed circuit board (not shown).

Alternatively, each of the driving devices 150a, 150b and 400 may be integrated on the display area (A) together with the plurality of signal lines S1 to Sn and D1 to Dm or the thin film transistors T1, T2 and T3, and the like.

Further, the driving devices 150a, 150b and 400 may be integrated into a single chip. In this case, at least one of the driving devices 150a, 150b and 400 or at least one circuit element constituting the driving devices 150a, 150b and 400 may be positioned outside the single chip.

Figure 6:
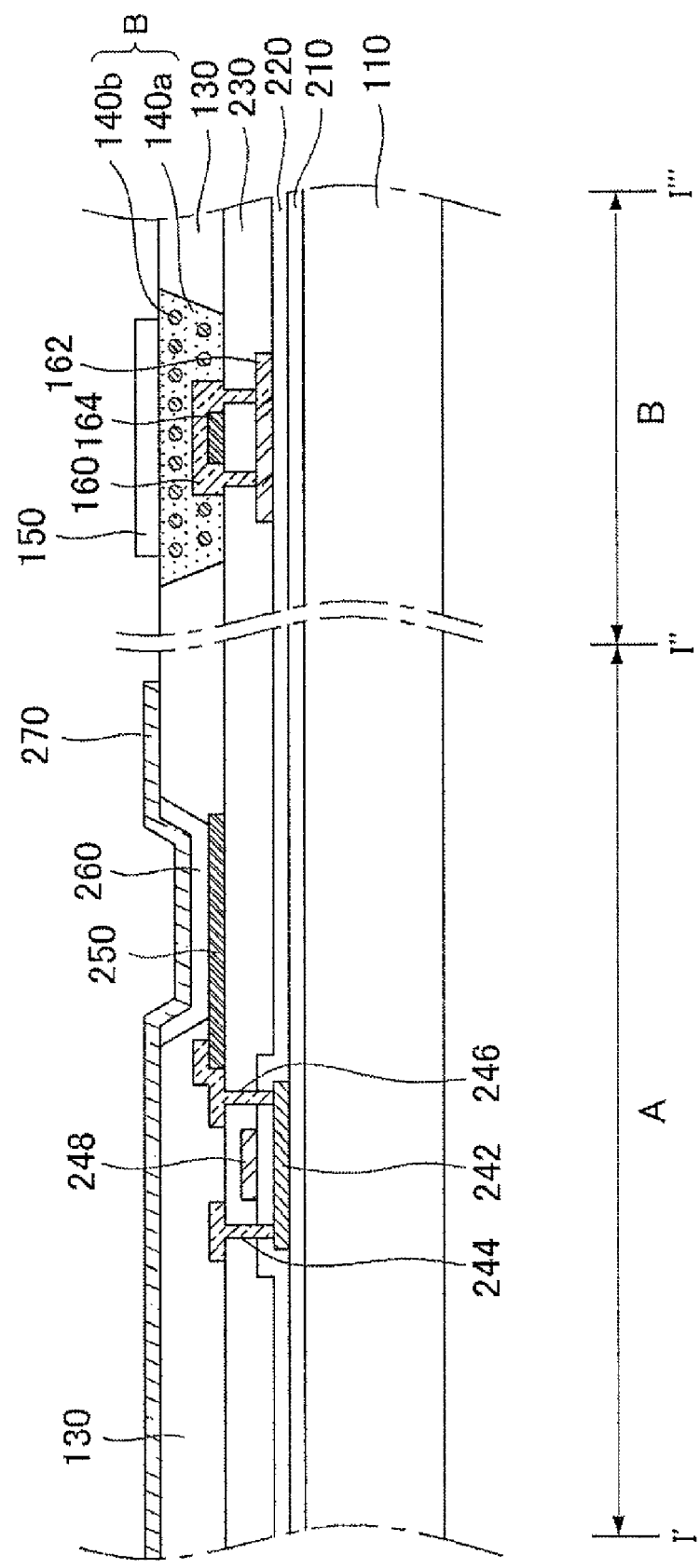
FIG. 6 is a cross-sectional view taken along lines I'-I" and I"-I''' of FIGS. 1 and 2.

FIG. 6 is a cross-sectional view taken along lines I'-I" and I"-I'" of FIGS. 1 and 2.

As shown in FIG. 6, the display area (A) of the display device 100 includes a plurality of subpixels 120. In the exemplary embodiment, an organic light emitting device including an emitting layer 260 made of an organic material will be now described as an example of the display device 100.

As shown, a buffer layer 210 is disposed on the first substrate 110 and a semiconductor layer 242 that is amorphous or polycrystal silicon is disposed on the buffer layer 210. A first insulating layer 220 is disposed on the semiconductor layer 242, and a gate electrode 248 is disposed on the first insulating layer 220 corresponding to a predetermined area of the semiconductor layer 242. Herein, the first insulating layer may be a gate insulating layer.

A second insulating layer 230 is disposed on a first substrate 110 including a gate electrode 248. Also, a source electrode 244 and a drain electrode 246 are disposed to be electrically connected to a predetermined area of a semiconductor layer through contact holes penetrating a first insulating layer and a second insulating layer. Herein, the second insulating layer may be an interlayer insulating layer.

Therefore, a thin film transistor includes a semiconductor layer 242, a first insulating layer 220, a gate electrode 248, a second insulating layer 230, a source electrode 244, and a drain electrode 246.

A first electrode 250 is disposed on the second insulating layer 230 and electrically connected to the source electrode 244 or the drain electrode 246. The first electrode 250 is formed before the source electrode 244 and the drain electrode 246 of the thin film transistor are formed. Then, the source electrode 244 and the drain electrode 246 are formed.

A third insulating layer 130 is formed on the first electrode 250. The third insulating layer includes an opening for exposing a predetermined area of the first electrode 250. An emitting layer 260 is disposed on the third insulating layer and the opening, and a second electrode 270 is disposed on the emitting layer 260. The third insulating layer 130 may be a pixel definition layer.

The pad area (B) of the display device 100 may include a buffer layer 210 on the substrate 110 and a first insulating layer 220 on the buffer layer 210.

A first conductive layer 162 may be disposed on the first insulating layer 220. The first conductive layer 162 is formed at the same time of forming the gate electrode 248 of the thin film transistor. The first conductive layer 162 may also made of the same material of the gate electrode 248.

A second insulating layer 230 may be disposed on the first insulating layer 220 and the first conductive layer 162 for insulating the first conductive layer 162. A second conductive layer 164 is disposed on the second insulating layer 230. The second conductive layer 164 is formed at the same time of forming the first electrode 250 of a light emitting diode, and made of the same material of the first electrode 250.

The second conductive layer 164 prevents voltage drop due to the resistance of the lines 170 disposed under the pad electrode 160. Therefore, an input signal can be accurately transferred to the elements of the display device 100.

A third conductive layer 160 is disposed on the second conductive layer 164. The third conductive layer 160 covers the second conductive layer 164 and is connected to the first conductive layer 162. The third conductive layer is formed at the same time of forming the source electrode 244 and the drain electrode 246 of the thin film transistor, and may be formed of the same material of the source electrode 244 and the drain electrode 246. The third conductive layer may be the pad electrode 160.

The third conductive layer may be electrically connected to the first conductive layer through a plurality of holes passing through the second insulating layer.

Figure 7:
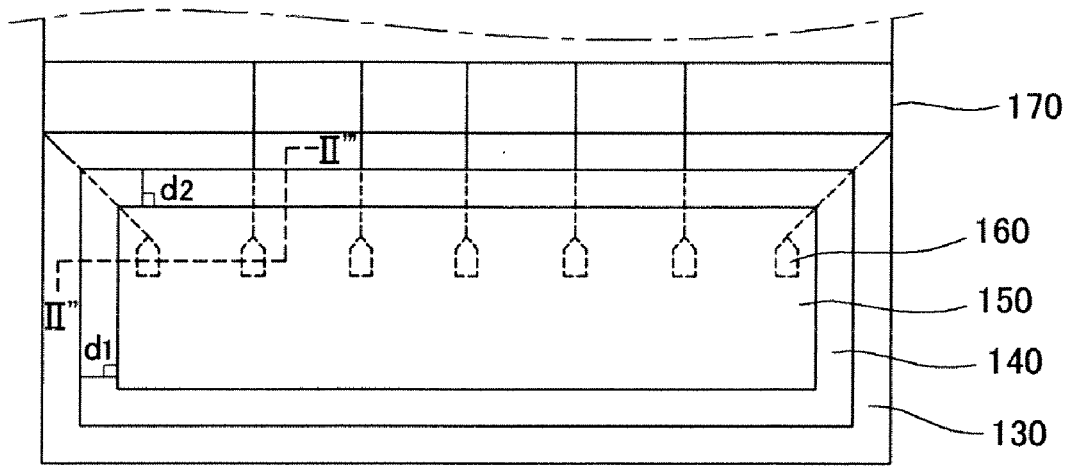
FIGS. 7 and 8 are plane views of a pad area of the display device according to the exemplary embodiment.
Figure 8:
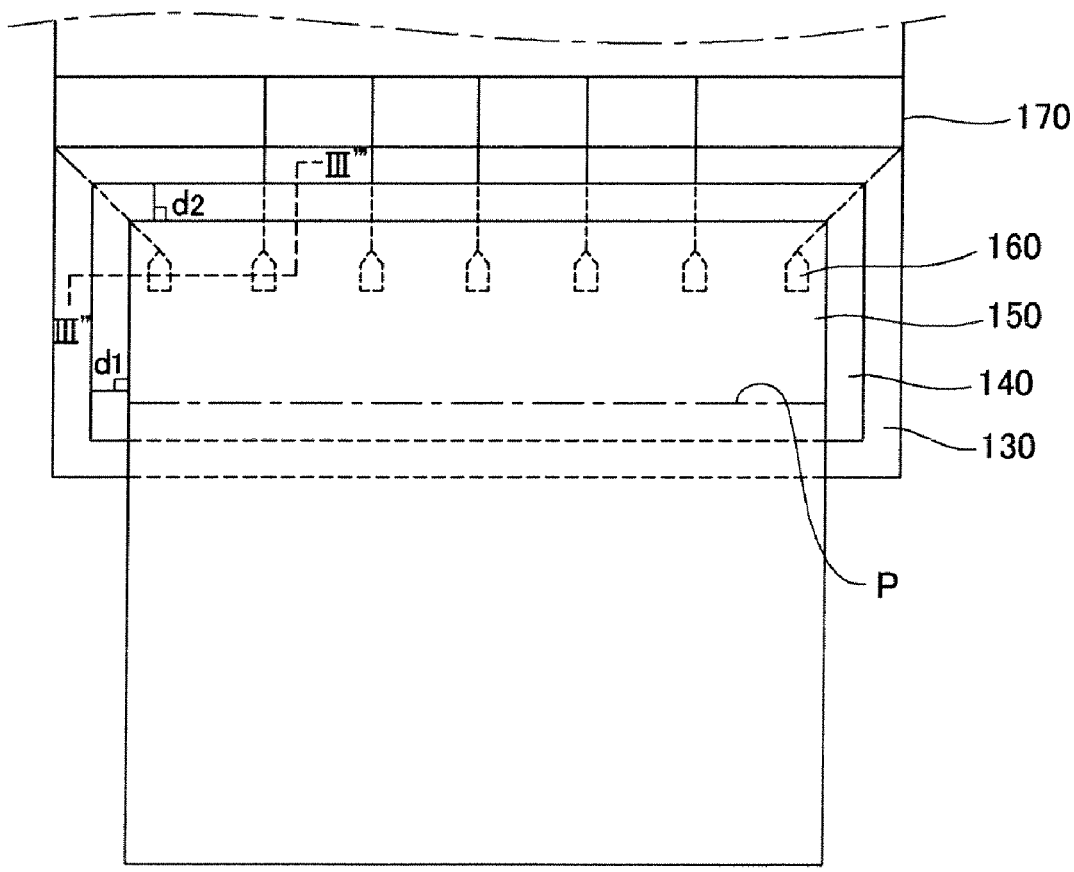
Figure 9:
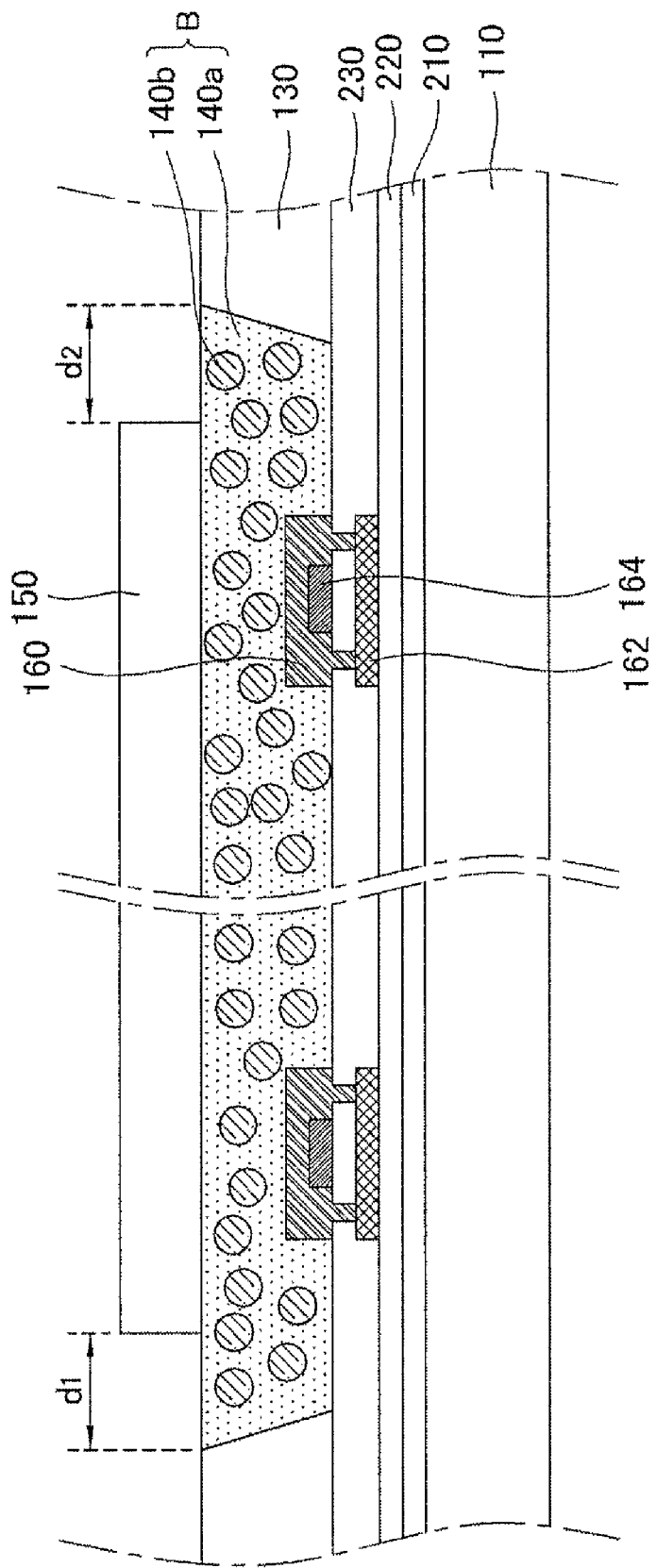
FIG. 9 is a cross-sectional view taken along lines II"-II''' or III"-III''' of FIGS. 7 and 8.

FIGS. 7 and 8 are plane views of the pad area (B) of the display device 100. FIG. 9 is a cross-sectional view taken along lines II"-II'" or III"-III'" of FIGS. 7 and 8.

As shown in FIG. 7 through FIG. 9, the display device 100 includes the pad area (B) including the pad electrode 160, the driver 150 for applying an electric signal received from the outside to the pad area (B), and the plurality of lines 170 for connecting the display area (A) to the driver 150 or the pad area (B) to the driver 150. The display device 100 includes a third insulating layer 130 including an opening formed around the pad area (B) to expose the pad electrode 160.

The display device 100 may include a conductive adhesive layer 140 on the pad area (B). Particularly, the conductive adhesive layer 140 may be an anisotropic conductive film including an adhesive material 140*a* made of thermosetting plastic and a conductive ball 140*b*.

The conductive adhesive layer 140 can attach the pad electrode 160 to the driver 150 on the pad area (B).

The display device 100 may be classified into a COG type as shown in FIG. 7 and a COF type as shown in FIG. 8 according to the method of mounting the driver 150. In case of the COG type, the driver 150 may be a driver IC 150. In case of COF, the driver 150 may be a flexible film 150 and a driver IC (not shown) formed on the flexible film.

The conductive adhesive layer 140 may be formed to be larger than the driver 150 in an area. Particularly, the area of a plane of the conductive adhesive layer 140 may be larger than the area of a plane where the conductive adhesive layer 140 adjoins the driver 150. Therefore, the entire plane of the driver 150 may be included on the plane of the conductive adhesive layer 140. Also, at the COF type, an area of the plane where the flexible film adjoins the conductive adhesive layer 140 may be included on the plane of the conductive adhesive layer 140.

In FIG. 8, a flexible film, which may become a driver, may be attached to the conductive adhesive layer up to the line P. Herein, the line P may be a longer side of the flexible film.

A vertical distance d1 ranging from a shorter side of the plane of the driver 150 to a shorter side of the plane of the conductive adhesive layer 140 may lies substantially in a range between 0.2 mm and 4 mm. When the vertical distance d1 is equal to or longer than 0.2 mm, moisture and oxygen are prevented from penetrating into an attaching area of the driver 150 and the pad electrode 160 when the driver 150 is attached to the pad electrode 160 and a moistureproofing agent is coated thereof in later.

When the vertical distance d1 is equal to or shorter than 4 mm, the moistureproofing agent is prevented from being come off when the driver 150 is attached to the pad electrode and the moistureproofing agent is coated thereon. Further, a process margin of a cutting device of the conductive adhesive layer 140 can be secured when the conductive adhesive layer 140 is attached.

A vertical distance d2 ranging from a longer side of the plane of the driver 150 to a longer side of the plane of the conductive adhesive layer 140 may lies substantially in a range between 0.1 and 1 mm. When the vertical distance d2 is equal to or longer than 0.1 mm, the conductive adhesive layer 140 overflows in a pressurizing process for attaching the driver 150 to the pad electrode, thereby extending a valid distance of moisture or oxygen penetration. Therefore, the moisture-proofing property is improved.

When the vertical distance d2 is equal to or shorter than 1 mm, the moistureproofing agent is prevented from being come off when the driver 150 is attached to the pad electrode and the moistureproofing agent is coated thereon, thereby further improving the moisture proofing property.

TABLE 3

| | d1 (mm) | | | | | | | | | | | |
|---|---|---|---|---|---|---|---|---|---|---|---|---|
| | 0 | 0.1 | 0.2 | 0.4 | 0.6 | ... | 3.8 | 3.9 | 4.0 | 4.1 | 4.2 | 4.4 |
| The number of defective Products | 35/50 | 8/50 | 0/50 | 0/50 | 0/50 | 0/50 | 0/50 | 0/50 | 0/50 | 2/50 | 7/50 | 9/50 |
| Defective cause | Penetration of moisture and oxygen | | | | | | | | | Moistureproofing agent come off | | |

TABLE 4

| | d2 (mm) | | | | | | | | |
|---|---|---|---|---|---|---|---|---|---|
| | 0 | 0.1 | 0.2 | 0.3 | ... | 0.8 | 0.9 | 1.0 | 1.1 |
| The number of defective products | 8/30 | 0/30 | 0/30 | 0/30 | 0/30 | 0/30 | 0/30 | 0/30 | 5/30 |
| Defective cause | Penetration of moisture and oxygen | | | | | | | | Moistureproofing agent come off |

Table 3 indicates the number of defective products depending on the vertical distance d1. Table 4 indicates the number of defective products depending on the vertical distance d2.

As indicated in Table 3, when the vertical distance d1 is shorter than 0.2 mm, defective products were detected because moisture and oxygen penetrate into the attaching area of the driver 150 and the pad electrode 160. When the vertical distance d1 is longer than 4 mm, defective products were detected because the moistureproofing agent comes off.

As indicated in Table 4, when the vertical distance d2 is shorter than 0.1 mm, defective products were detected because moisture and oxygen penetrate into the attaching area of the driver 150 and the pad electrode 160. When the vertical distance d2 is longer than 1 mm, defective products were detected because the moistureproofing agent comes off.

Therefore, the moisture proofing property can be improved in a following moistureproofing agent coating process by controlling a coating area of the conductive adhesive layer 140 used to attach the pad electrode to the driver 150.

As described above, the display device 100 can prevent the pad electrode 160 from being eroded. Therefore, the reliability of the display device 100 is improved.

Figure 10:
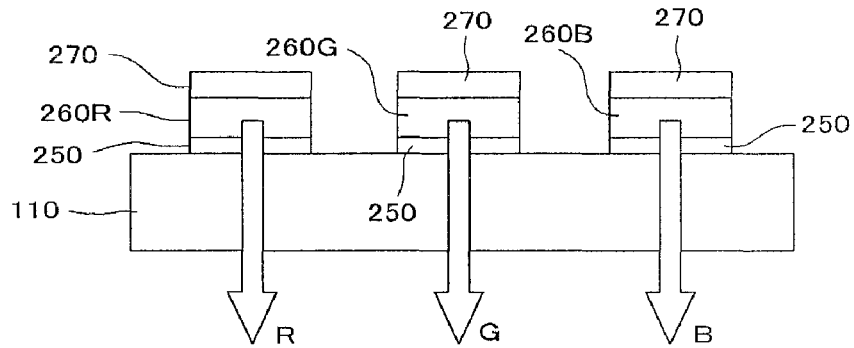
FIGS. 10 to 12 illustrate various implementations of a color image display method in the display device according to the exemplary embodiment.
Figure 11:
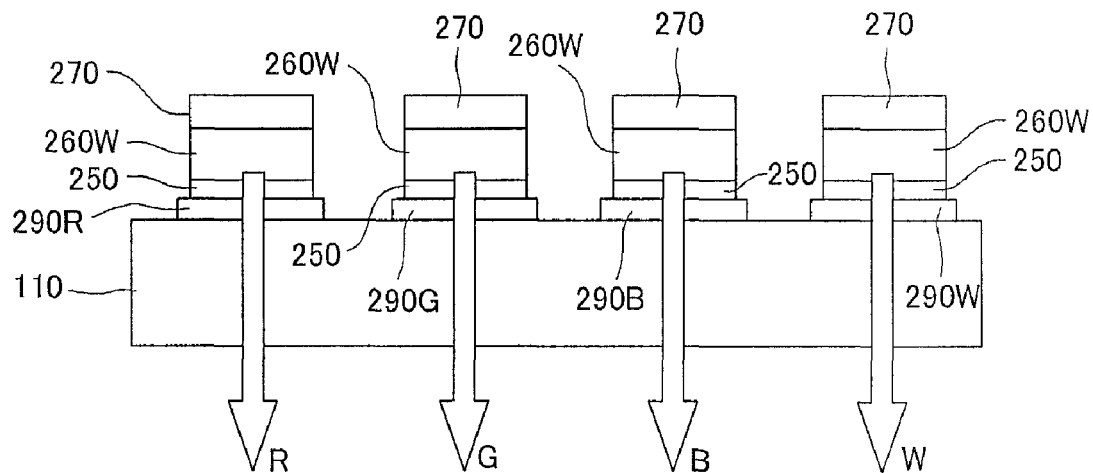
Figure 12:
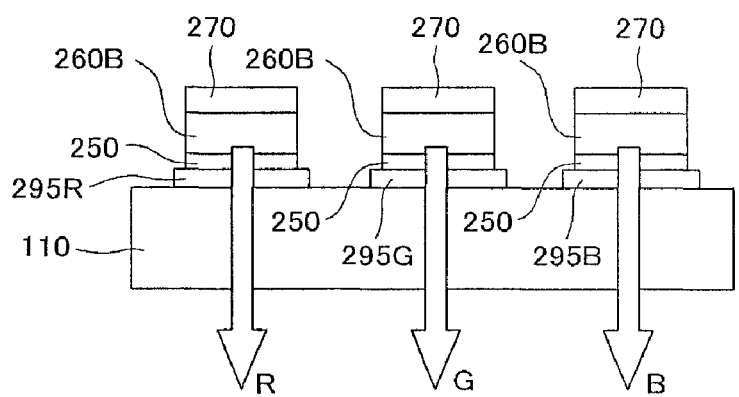

FIGS. 10 to 12 illustrate various implementations of a color image display method in the display device according to the exemplary embodiment.

FIG. 10 illustrates a color image display method in a display device separately including a red emitting layer 260R, a green emitting layer 260G and a blue emitting layer 260B which emit red, green and blue light, respectively.

The red, green and blue light produced by the red, green and blue emitting layers 260R, 260G and 260B is mixed to display a color image.

It may be understood in FIG. 10 that the red, green and blue emitting layers 260R, 260G and 260B each include an electron transporting layer, a hole transporting layer, and the like, on upper and lower portions thereof. It is possible to variously change the arrangement and the structure between the additional layers such as the electron transporting layer and the hole transporting layer and each of the red, green and blue emitting layers 260R, 260G and 260B.

FIG. 11 illustrates a color image display method in a display device including a white emitting layer 260W, a red color filter 290R, a green color filter 290G, a blue color filter 290B, and a white color filter 260W.

As shown in FIG. 11, the red color filter 290R, the green color filter 290G, the blue color filter 290B, and the white color filter 290W each transmit white light produced by the white emitting layer 260W to produce red light, green light, blue light, and white light. The red, green, blue, and white light is mixed to display a color image. The white color filter 290W may be removed depending on color sensitivity of the white light produced by the white emitting layer 260W and combination of the white light and the red, green and blue light.

While FIG. 11 has illustrated the color display method of four subpixels using combination of the red, green, blue, and white light, a color display method of three subpixels using combination of the red, green, and blue light may be used.

It may be understood in FIG. 11 that the white emitting layer 260W includes an electron transporting layer, a hole transporting layer, and the like, on upper and lower portions thereof. It is possible to variously change the arrangement and the structure between the additional layers such as the electron transporting layer and the hole transporting layer and the white emitting layer 270W.

FIG. 12 illustrates a color image display method in a display device including a blue emitting layer 260B, a red color change medium 295R, a green color change medium 295G, a blue color change medium 295B.

As shown in FIG. 12, the red color change medium 295R, the green color change medium 295G, and the blue color change medium 295B each transmit blue light produced by the blue emitting layer 260B to produce red light, green light and blue light. The red, green and blue light is mixed to display a color image.

The blue color change medium 295B may be removed depending on color sensitivity of the blue light produced by the blue emitting layer 295B and combination of the blue light and the red and green light.

It may be understood in FIG. 12 that the blue emitting layer 260B includes an electron transporting layer, a hole transporting layer, and the like, on upper and lower portions thereof. It is possible to variously change the arrangement and the structure between the additional layers such as the electron transporting layer and the hole transporting layer and the blue emitting layer 260B.

While FIGS. 10 and 11 have illustrated and described the display device having a bottom emission structure, the exemplary embodiment is not limited thereto. The display device according to the exemplary embodiment may have a top emission structure, and thus the structure of the display device according to the exemplary embodiment may be changed depending on the top emission structure.

While FIGS. 10 to 12 have illustrated and described three kinds of color image display method, the exemplary embodiment is not limited thereto. The exemplary embodiment may use various kinds of color image display method whenever necessary.

Figure 13:
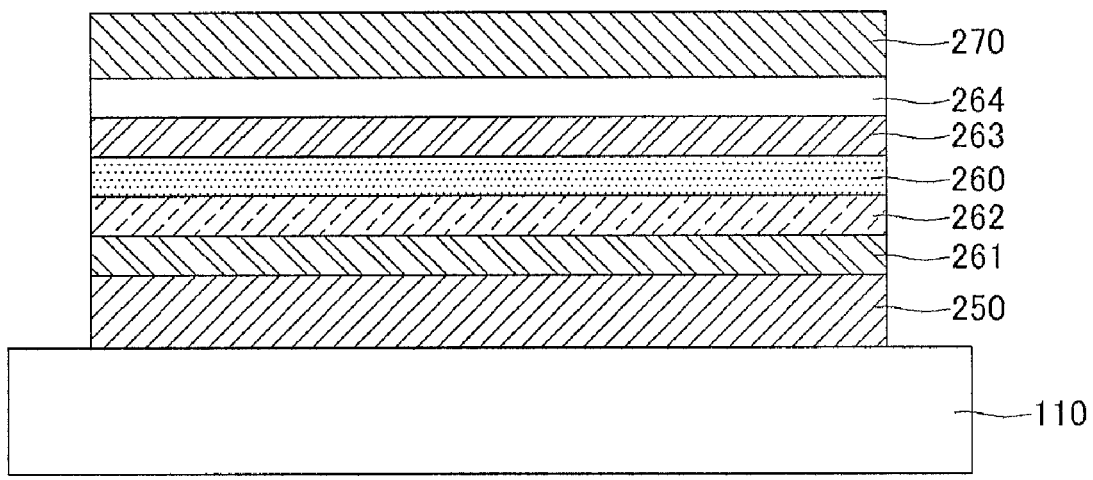
FIG. 13 is a cross-sectional view of the display device according to the exemplary embodiment.

FIG. 13 is a cross-sectional view of the display device according to the exemplary embodiment.

As shown in FIG. 13, the display device according to the exemplary embodiment includes the substrate 110, the first electrode 250 positioned on the substrate 110, a hole injection layer 261 positioned on the first electrode 250, a hole transporting layer 262, an emitting layer 260, an electron transporting layer 263, an electron injection layer 264, and the second electrode 270 positioned on the electron injection layer 264.

The hole injection layer 261 may function to facilitate the injection of holes from the first electrode 250 to the emitting layer 260. The hole injection layer 261 may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto.

The hole injection layer 261 may be formed using an evaporation method or a spin coating method.

The hole transporting layer 262 functions to smoothly transport holes. The hole transporting layer 262 may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto.

The hole transporting layer 262 may be formed using an evaporation method or a spin coating method.

The emitting layer 260 may be formed of a material capable of producing red, green, blue or white light such as, for example, a phosphorescence material or a fluorescence material.

In case that the emitting layer 260 emits red light, the emitting layer 260 includes a host material including carbazole biphenyl (CBP) or N,N-dicarbazolyl-3,5-benzene (mCP). Further, the emitting layer 260 may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the emitting layer 260 emits green light, the emitting layer 260 includes a host material including CBP or mCP. Further, the emitting layer 260 may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the emitting layer 260 emits blue light, the emitting layer 260 includes a host material including CBP or mCP. Further, the emitting layer 260 may be formed of a phosphorescence material including a dopant material including (4,6-F2ppy)2Irpic or a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transporting layer 263 functions to facilitate the transportation of electrons. The electron transporting layer 263 may be formed of at least one selected from the group consisting of Alq3(tris(8-hydroxyquinolino)aluminum, PBD, TAZ, spiro-PBD, BAlq, and SAlq, but is not limited thereto.

The electron transporting layer 263 may be formed using an evaporation method or a spin coating method.

The electron transporting layer 263 can also function to prevent holes, which are injected from the first electrode 250 and then pass through the emitting layer 260, from moving to the second electrode 270. In other words, the electron transporting layer 263 serves as a hole stop layer, which facilitates the coupling of holes and electrons in the emitting layer 260.

The electron injection layer 264 functions to facilitate the injection of electrons. The electron injection layer 264 may be formed of Alq3(tris(8-hydroxyquinolino)aluminum), PBD, TAZ, spiro-PBD, BAlq or SAlq, but is not limited thereto.

The electron injection layer 264 may be formed of an organic material and an inorganic material forming the electron injection layer 264 through a vacuum evaporation method.

The hole injection layer 261 or the electron injection layer 264 may further include an inorganic material. The inorganic material may further include a metal compound. The metal compound may include alkali metal or alkaline earth metal.

The metal compound including the alkali metal or the alkaline earth metal may include at least one selected from the group consisting of LiQ, LiF, NaF, KF, RbF, CsF, FrF, BeF2, MgF2, CaF2, SrF2, BaF2, and RaF2, but is not limited thereto.

Thus, the inorganic material inside the electron injection layer 264 facilitates hopping of electrons injected from the second electrode 270 to the emitting layer 260, so that holes and electrons injected into the emitting layer 260 are balanced. Accordingly, emission efficiency can be improved.

Further, the inorganic material inside the hole injection layer 261 reduces the mobility of holes injected from the first electrode 250 to the emitting layer 260, so that holes and electrons injected into the emitting layer 260 are balanced. Accordingly, emission efficiency can be improved.

At least one of the electron injection layer 264, the electron transporting layer 263, the hole transporting layer 262, the hole injection layer 261 may be omitted.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A display device, comprising:
a substrate;
a display area on the substrate, the display area including a plurality of subpixels;
a pad area on the substrate, the pad area including a pad electrode;
an insulating layer having an opening formed around the pad area for exposing the pad electrode;
a conductive adhesive layer on the pad electrode within the opening so that the size of the conductive adhesive layer is limited by the opening; and
a driver on the conductive adhesive layer, the driver being attached to the pad electrode using the conductive adhesive layer,
wherein one surface of the conductive adhesive layer includes one surface of the driver,
a distance ranging from a shorter side of one surface of the driver to a shorter side of one surface of the conductive adhesive layer lies substantially in a range between 0.2 mm and 4 mm, and
the distance is configured to be capable of preventing a moisture-proofing agent coated on the driver from being come off and reducing a number of defective display devices to less than 16% by improving moisture proofing properties.

2. The display device of claim 1, wherein the driver is a driver integrated circuit.

3. The display device of claim 1, wherein the conductive adhesive layer is an anisotropic conductive film.

4. The display device of claim 1, wherein the subpixels include a first electrode, an emitting layer, and a second electrode.

5. The display device of claim 1, further comprising a thin film transistor including a semiconductor layer, a gate insulating layer, a gate electrode, a source electrode, and a drain electrode on the substrate.

6. A display device, comprising:
a substrate;
a display area on the substrate, the display area including a plurality of subpixels;
a pad area on the substrate, the pad area including a pad electrode;
an insulating layer having an opening formed around the pad area for exposing the pad electrode;
a conductive adhesive layer on the pad electrode within the opening so that the size of the conductive adhesive layer is limited by the opening; and
a driver on the conductive adhesive layer, the driver being attached to the pad electrode using the conductive adhesive layer,
wherein one surface of the conductive adhesive layer includes one surface of the driver,
a distance ranging from a longer side of one surface of the driver to a longer side of one surface of the conductive adhesive layer lies substantially in a range between 0.1 mm and 1 mm, and the distance is configured to be capable of preventing a moisture-proofing agent coated on the driver from being come off and reducing a number of defective display devices to less than 27% by improving moisture proofing properties.

7. The display device of claim 6, wherein the driver is a driver integrated circuit.

8. The display device of claim 6, wherein the conductive adhesive layer is an anisotropic conductive film.

9. The display device of claim 6, wherein the subpixels include a first electrode, an emitting layer, and a second electrode.

10. The display device of claim 6, further comprising a thin film transistor including a semiconductor layer, a gate insulating layer, a gate electrode, a source electrode, and a drain electrode on the substrate.

11. A display device, comprising:
   a substrate;
   a display area on the substrate, the display area including a plurality of subpixels;
   a pad area on the substrate, the pad area including a pad electrode;
   an insulating layer having an opening formed around the pad area for exposing the pad electrode;
   a conductive adhesive layer on the pad electrode within the opening so that the size of the conductive adhesive layer is limited by the opening; and
   a driver on the conductive adhesive layer, the driver being attached to the pad electrode using the conductive adhesive layer,
   wherein one surface of the conductive adhesive layer includes one surface of the driver,
   a distance ranging from a shorter side of one surface of the driver to a shorter side of one surface of the conductive adhesive layer lies substantially in a range between 0.2 mm and 4 mm,
   a distance ranging from a longer side of one surface of the driver to a longer side of one surface of the conductive adhesive layer lies substantially in a range between 0.1 mm and 1 mm,
   the distances are configured to be capable of preventing a moisture-proofing agent coated on the driver from being come off.

* * * * *